United States Patent
Hong et al.

(12) 
(10) Patent No.: US 6,218,204 B1
(45) Date of Patent: Apr. 17, 2001

(54) CAPACITANCE COMPENSATION FOR TOPOLOGICAL MEASUREMENTS IN A SEMICONDUCTOR DEVICE

(75) Inventors: Jin-Seog Hong, Incheon; Jung-Hyeon Lee, Kyunggi-do; Ho-Young Kang, Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/326,557

(22) Filed: Jun. 7, 1999

(30) Foreign Application Priority Data

Jun. 5, 1998 (KR) .................................................. 98-20857

(51) Int. Cl.⁷ .................................................. H01L 21/00
(52) U.S. Cl. .............................................. 438/20; 438/20
(58) Field of Search ............................. 438/20, 21, 599, 438/636, 648, 597, 687

(56) References Cited

U.S. PATENT DOCUMENTS

| 4,103,226 | * | 7/1978 | Fromson et al. | ........................ 324/61 |
| 5,744,856 | * | 4/1998 | Rostoker | .............................. 257/618 |

* cited by examiner

*Primary Examiner*—David Nelms
*Assistant Examiner*—David Nhu
(74) *Attorney, Agent, or Firm*—Jones Volentine, L.L.C.

(57) ABSTRACT

Reduction in focusing error of an exposure process includes forming a conductive layer over a wafer whose topology is to be measured by a capacitance gauge. The conductive layer is thick enough such that differences in capacitance measured by the capacitance gauge tracking apparatus are not due to differences in underlying material and structure on the wafer. Thus, accurate measurement of the real topology of wafer by capacitance gauge tracking apparatus may be realized. As a result, the subsequent exposure processing is reliable.

10 Claims, 4 Drawing Sheets

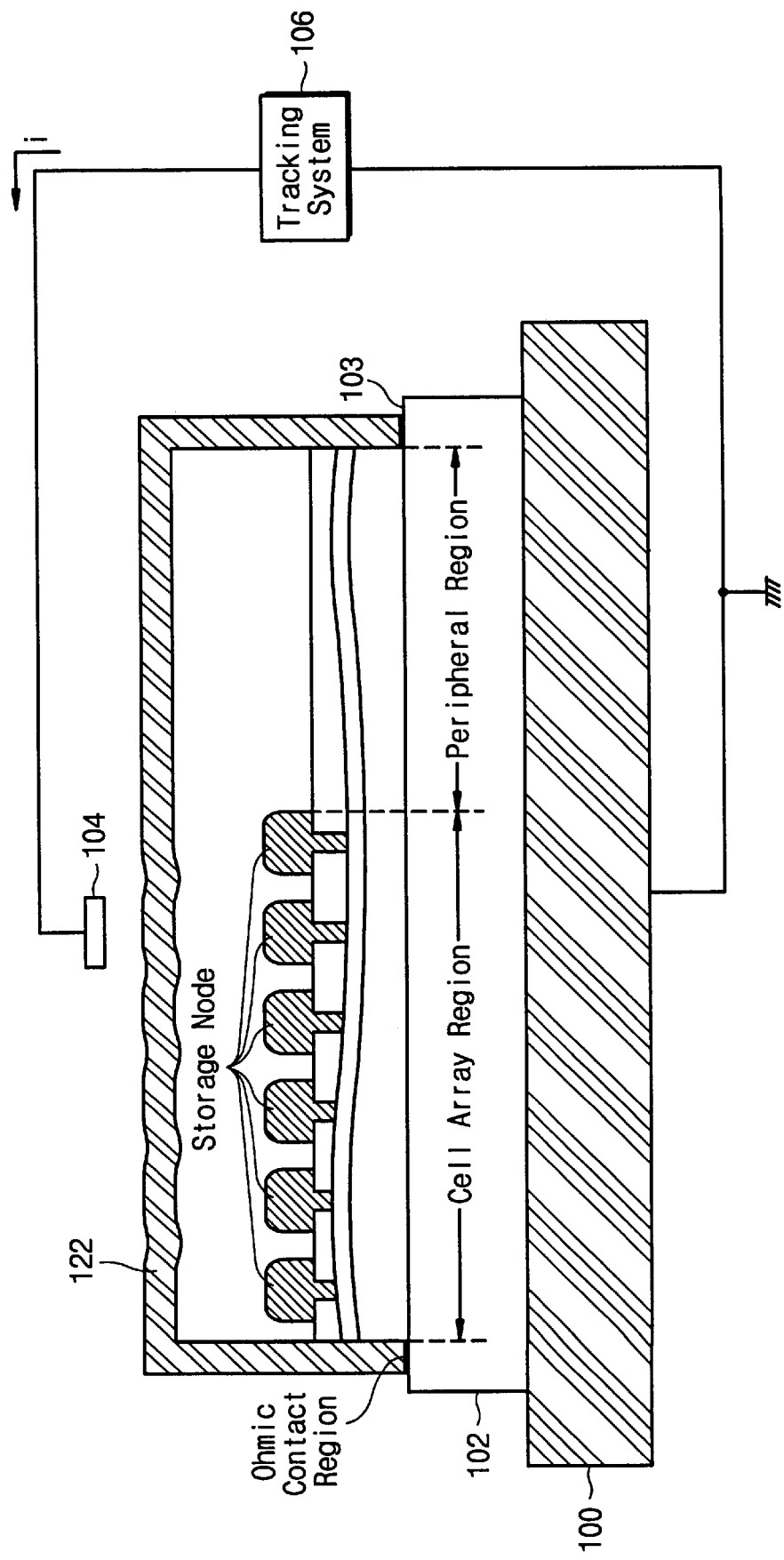

CAPACITANCE COMPENSATION FOR TOPOLOGICAL MEASUREMENTS IN A SEMICONDUCTOR DEVICE

CROSS-REFERENCES TO RELATED APPLICATIONS

The present application claims priority under 35 U.S.C. §119 to Korean Patent Application No. 98-20857 filed on Jun. 5, 1998, the entire contents of which are hereby incorporated by reference for all purposes.

BACKGROUND OF THE INVENTION

1. Field of the Invention

The present invention relates to a semiconductor fabrication, and more particularly to accurately measuring topology of a wafer, thereby allowing reduction of focusing error of an exposure process.

2. Description of Related Art

In a DRAM of interest, a lower electrode layer in the information storing capacitor of each memory cell extends vertically upwards, the difference in height between a memory cell array region( or area) and a peripheral circuit region( or area) is very large.

Scanner systems require accurately controlled-focusing and tilting so as to obtain exposure reliability to a wafer whereon a variety of structures are formed. One example of a system which controls the focusing and tilting is a capacitance gauge tracking system(hereinafter referred to "CGTS")(see FIG. 1). The CGTS tracks the capacitance between a wafer surface and a capacitance gauge to control focusing and tilting before the exposure process. Another example of system is known optical multi-point focusing system.

FIG. 1 schematically shows a CGTS 16. As illustrated, a wafer 12 is mounted over a wafer stage 10. The CGTS 16 measures the capacitance between the wafer 12 surface and a capacitance gauge 14 by moving the grounded wafer 12 or the capacitance gauge 14 according to X–Y direction. The resulting equivalent circuits in accordance with tracking of FIG. 1 are schematically illustrated in FIGS. 2A and 2B, respectively at peripheral region and cell array region. In FIGS. 2A and 2B, a reference numeral "R" represents equivalent resistance of the wafer, "C-oxide" represents capacitance of an oxide layer at the peripheral region, "$R_p$" represents equivalent resistance of a polysilicon, "C-air" represents capacitance of an air between the wafer 12 and capacitance gauge 14, and a reference numeral "20" represents constant current source applied from CGTS 16.

From the equivalent circuits of FIGS. 2A and 2B, C-peri (capacitance of peripheral region), C-array(capacitance of cell array region), C(capacitance) are given by the following equations, $$\text{C-peri} = \frac{1}{\frac{1}{\text{C-air}} + \frac{1}{\text{C-oxide}}} \quad (1)$$

$$\text{C-array} = \text{C-air} \quad (2)$$

$$C = \epsilon(A/d) \quad (3)$$

where "$\epsilon$" is permittivity, "A" is an area, and "d" is a distance between adjacent conductors.

Permittivity of air is about 1 and permittivity of an oxide layer is about 4. From the above mentioned equations, C-air(capacitance of air) becomes A/100, and C-oxide (capacitance of oxide) becomes 4A. If the peripheral region is filled with about 1 micrometers thick oxide layer, C-peri becomes A/104 from equation 1. There should be the difference of about 4 micrometers in height between cell array region and peripheral region if the same C-peri(i.e., A/104) is obtained by using air instead of the oxide.

However, the real height difference there between is about 0.3 micrometers. Therefore, CGTS incorrectly tracks the capacitance of the wafer surface(i.e., calculated capacitance differs from the real capacitance), since capacitances of the polysilicon(cell array region) and the oxide layer(peripheral region) are different from one another. As a result, defocusing problems can arise during the exposure process.

SUMMARY OF THE INVENTION

The present invention is therefore directed to a method of measuring a topology of a wafer and a wafer to be measured which substantially overcomes one or more of the problems due to the limitations and disadvantages of the related art.

The above and other objects may be realized by forming a conductive layer over a wafer to compensate for variation of capacitance caused by high stacked capacitor in the cell array region. Due to the conductive layer over the wafer surface, real topology of the wafer can be accurately measured by the capacitance gauge tracking system without error due to material and structure below the conductive layer.

The above and other objects may also be met be provided such a wafer to be measured including a conductive layer over a selected region and in a contact with the selected region.

The conductive layer may be made of one selected from the group consisting of titanium nitride layer, metal layer and conductive photoresist layer. The conductive layer may also serve as an anti-reflection coating(ARC) layer.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention may be understood and its objects will become apparent to those skilled in the art by reference to the accompanying drawings as follows:

FIG. 3 schematically shows the CGTS(capacitance gauge tracking system) tracking the capacitance between the wafer surface and the capacitance gauge in accordance with the present invention.

DETAILED DESCRIPTION OF THE PREFERRED EMBODIMENTS

Figure 1:
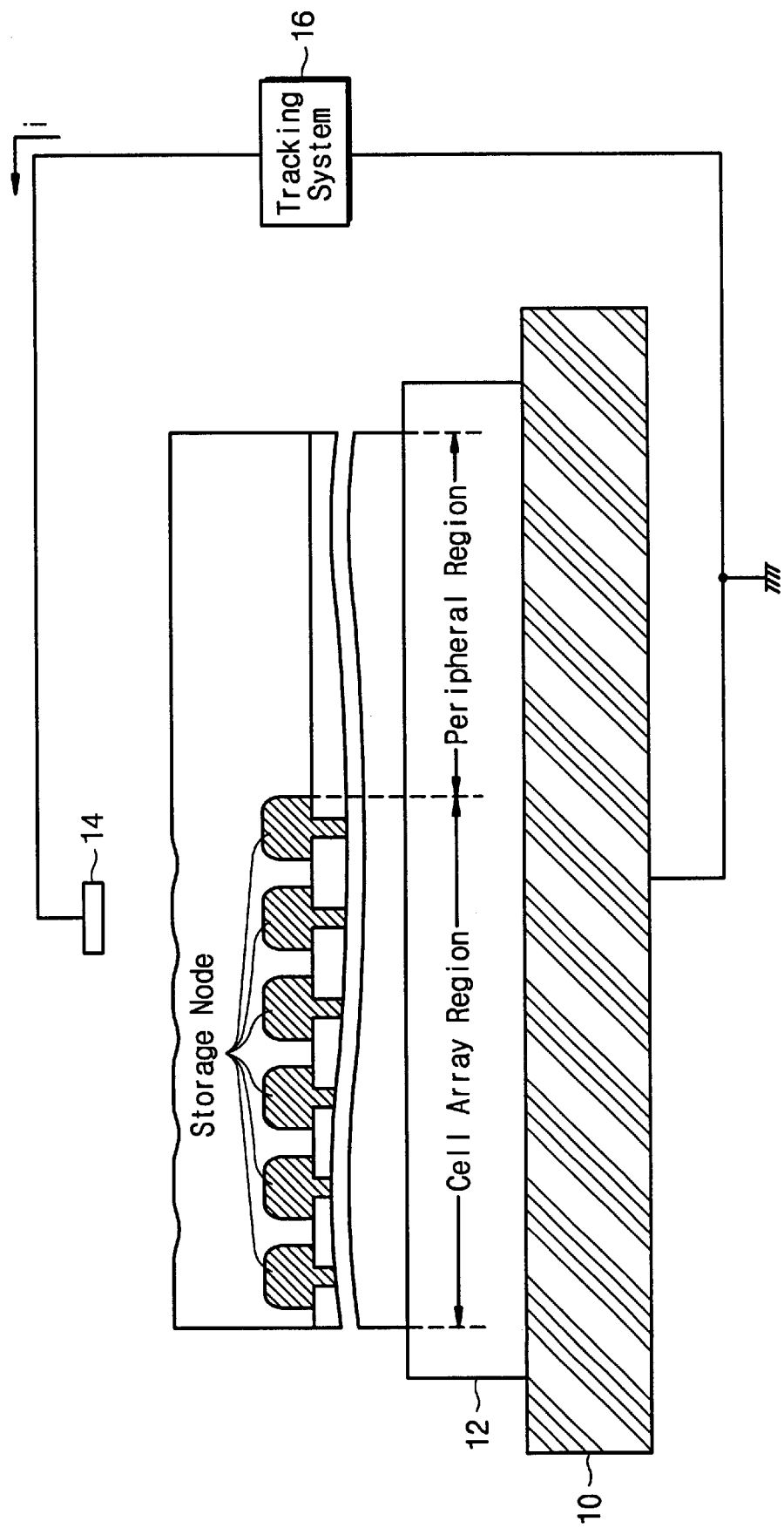
FIG. 1 schematically shows the CGTS(capacitance gauge tracking system) tracking the capacitance between the wafer surface and the capacitance gauge in accordance with related art.
Figure 2A:
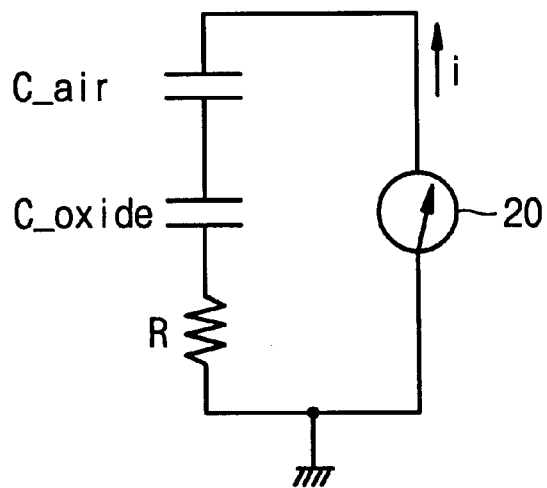
FIGS. 2A and 2B are equivalent circuits of peripheral region and cell array region of FIG. 1.
Figure 2B:
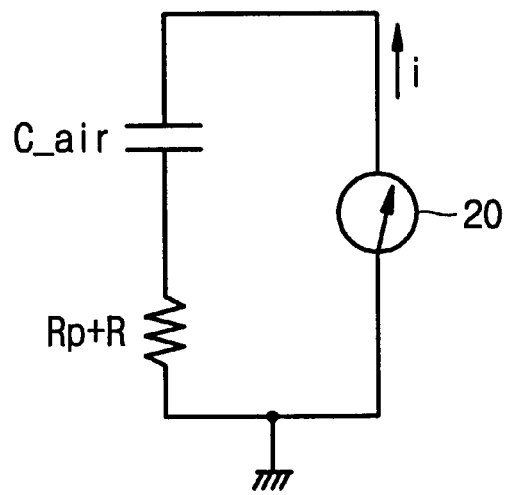

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Referring to FIG. 3, before an exposure process of a photolithography, a conductive layer 122 is formed on a wafer 102. The conductive layer 122 is in ohmic contact with a selected portion 103 of the wafer 102. The selected portion 103 does not contain integrated circuits. The resulting wafer 102 having the conductive layer 122 is mounted over a wafer stage 100. The CGTS 106 measures the capacitance between the wafer 102 surface and a capacitance gauge 104 by moving the grounded wafer 102 or the capacitance gauge 104 according to X–Y direction. It is noted that only the capacitance of air(C-air) exists between the wafer surface and the capacitance gauge. Therefore, the real topology of the wafer surface is accurately measured without regard to material and integrated circuit structure formed thereon. Accordingly, defocusing error during the exposure process can be prevented.

Referring still to FIG. 3, the wafer 102 which is to be measured by the capacitance gauge tracking system is mounted on the wafer stage 100. The wafer 102 is directly grounded or indirectly grounded through wafer stage 100. It is apparent to those skilled in the art that a plurality of integrated circuits is formed on the wafer 102, though not shown in the drawings. In the drawing, only one integrated circuit chip is illustrated for clarity. The wafer includes a cell array region and a peripheral region. In case of COB (capacitor over bit line) structure of DRAM with 64M or more, there is a large difference in height between the cell array region and the peripheral region. As a result, the topology of wafer surface is not accurately tracked by the capacitance gauge tracking system and above mentioned problem encountered in the prior art aries.

For this reason, an ohmic-contacted conductive layer 122 is formed over the wafer for accurate tracking. The formation of the conductive layer in ohmic contact with the wafer is as follows:

(1) forming a photoresist layer pattern over the wafer to expose desired portion of the wafer whereon ohmic contact is formed;

(2) using the photoresist layer pattern and etching the exposed portion to expose wafer surface;

(3) using the photoresist layer pattern and performing implanting to form doped region on and in the exposed wafer; and (4) removing the photoresist layer pattern and ohmic contacted conductive layer 122 is formed as shown in FIG. 3.

After formation of the ohmic-contacted conductive layer 122, the capacitance between the wafer surface and the capacitance gauge is measured. At this time, the conductive layer 122 serves as an anti-reflection coating layer for capacitance. The conductive layer 122 may be of a metal, a semiconductor material, such as titanium nitride, or a conductive photoresist. The ohmic-contacted conductive layer 122 is thick enough so that the capacitance measured by the capacitance gauge is no longer influenced by the difference in materials in the cell array region and the peripheral region. The actual thickness will depend on the material selected for the conductive layer 122.

Figure 4:
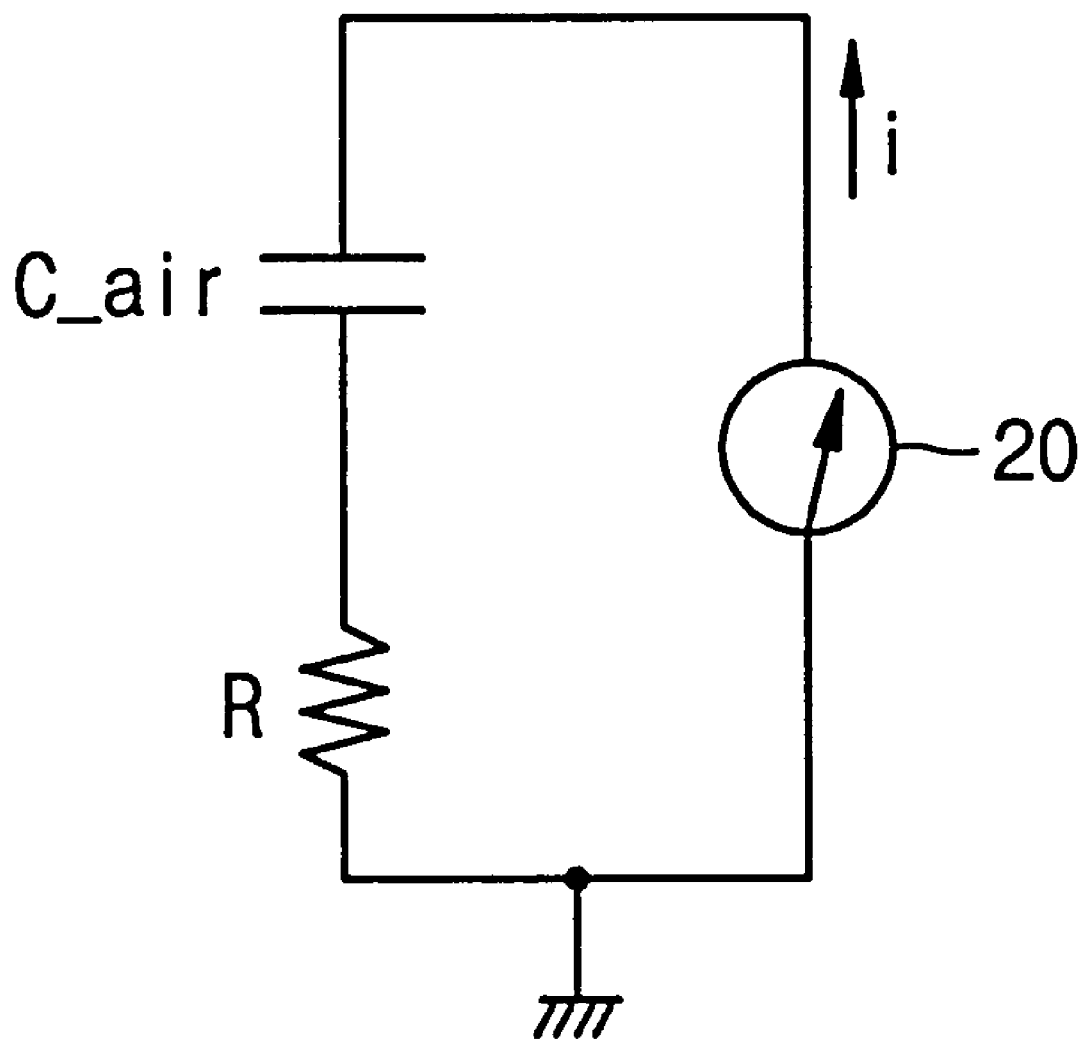
FIG. 4 is an equivalent circuit of both peripheral and cell array regions of FIG. 3.

FIG. 4 is an equivalent circuit of both peripheral and cell array regions of FIG. 3. Unlike in the prior art, there exists only air capacitance(C-air) between the capacitor gauge and the wafer surface due to the presence of the conductive layer. As a result, the real topology of the wafer surface can be accurately measured.

Thus, in accordance with the present invention, the provision of conductive layer on a wafer to be topologically measured allows accurate measurement thereof. Subsequent conventional photography process may therefore be reliably performed.

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation. Thus, the scope of the invention should be determined by the appended claims and their legal equivalents, rather than by the examples given.

What is claimed is:

1. A method of measuring topology of a wafer in a semiconductor device, said method comprising:

providing a wafer having at least one integrated circuit at a predetermined position thereof, the at least one integrated circuit including at least one layer;

forming a conductive layer over all of the at least one integrated circuit on the wafer, the conductive layer being in ohmic contact with the wafer at a selected region of the wafer, the selected region of the wafer being without integrated circuits; and measuring a wafer topology of the water before an exposure process with a capacitance gauge tracking apparatus, wherein the conductive layer is thick enough such that differences in capacitance measured by the capacitance gauge tracking apparatus are only due to the wafer topology.

2. The method according to claim 1, wherein said forming includes selecting a material for the conductive layer from the group consisting of a titanium nitride layer, a metal layer and a conductive photoresist layer.

3. The method according to claim 1, wherein said forming includes selecting a material for the conductive layer which also serves as an anti-reflection coating layer for capacitance.

4. A method of measuring topology of a wafer in a semiconductor device, said method comprising:

providing a wafer having at least one integrated circuit at a predetermined position thereof, the at least one integrated circuit including at least one layer;

forming a conductive layer over all of the at least one integrated circuit on the wafer, the conductive layer being in ohmic contact with the wafer at a selected region of the wafer, the selected region of the wafer being without integrated circuits; and measuring a wafer topology of the wafer before an exposure process with a capacitance gauge tracking apparatus, wherein the conductive layer is thick enough such that differences in capacitance measured by the capacitance gauge tracking apparatus are not generated.

5. The method according to claim 4, wherein said forming includes selecting a material for the conductive layer from the group consisting of a titanium nitride layer, a metal layer and a conductive photoresist layer.

6. The method according to claim 4, wherein said forming includes selecting a material for the conductive layer which also serves as an anti-reflection coating layer for capacitance.

7. A method of forming a conductive layer in ohmic contact with a wafer, said method comprising: measuring topology of a wafer in a semiconductor device including providing a wafer having at least one integrated circuit at a predetermined position thereof, the at least one integrated circuit including at least one layer, forming a conductive layer over all of the at least one integrated circuit on the wafer, the conductive layer being in ohmic contact with the wafer at a selected region of the wafer, the selected region of the wafer being without integrated circuit, and measuring a wafer topology of the wafer before an exposure process with a capacitance gauge tracking apparatus, wherein the conductive layer is thick enough such that differences in capacitance measured by the capacitance gauge tracking apparatus are only due to the wafer topology; and controlling an exposure process in accordance with topology of the wafer from said measure.

8. The method of claim 7, wherein the exposure process includes:

forming a photoresist layer pattern over the wafer in accordance with a desired portion where ohmic contact is to be formed;

performing creation steps in accordance with the photoresist layer pattern; and removing the photoresist layer pattern and the conductive layer.

9. A method of forming a conductive layer in ohmic contact with a wafer, said method comprising:

measuring topology of a wafer in a semiconductor device including providing a wafer having at least one integrated circuit at a predetermined position thereof, the at least one integrated circuit including at least one layer, forming a conductive layer over all of the at least one integrated circuit on the wafer, the conductive layer being in ohmic contact with the wafer at a selected region of the wafer, the selected region of the wafer being without integrated circuits, and measuring a wafer topology of the wafer before an exposure process with a capacitance gauge tracking apparatus, wherein the conductive layer is thick enough such that differences in capacitance measured by the capacitance gauge tracking apparatus are not generated; and controlling an exposure process in accordance with topology of the wafer from said measuring.

10. The method of claim 9, wherein the exposure process includes:

forming a photoresist layer pattern over the wafer in accordance with a desired portion where ohmic contact is to be formed;

performing creation steps in accordance with the photoresist layer pattern; and removing the photoresist layer pattern and the conductive layer.

* * * * *